United States Patent [19]

Avila et al.

[11] Patent Number: 4,706,047
[45] Date of Patent: Nov. 10, 1987

[54] FREQUENCY EXTENDED DIGITALLY GENERATED FM

[75] Inventors: Louis J. Avila, Costa Mesa; John E. Merritt, Newport Beach; Norman G. Hempling, Villa Park, all of Calif.

[73] Assignee: Ford Aerospace & Communications Corporation, Detroit, Mich.

[21] Appl. No.: 936,528

[22] Filed: Dec. 1, 1986

[51] Int. Cl.$^4$ ............................................. H03C 3/00
[52] U.S. Cl. ........................................ 332/19; 331/23; 455/118
[58] Field of Search ............... 332/16 R, 19, 21; 331/23; 455/110, 112, 113, 118; 375/44, 120

[56] References Cited

U.S. PATENT DOCUMENTS

| | | | |
|---|---|---|---|
| 3,622,913 | 11/1971 | Shipley | 332/16 |
| 4,074,209 | 2/1978 | Lysobey | 332/19 |
| 4,286,237 | 8/1981 | James | 332/19 |
| 4,387,351 | 6/1983 | Furiga et al. | 332/19 |
| 4,647,875 | 3/1987 | Argintaru et al. | 331/23 |

Primary Examiner—Eugene R. LaRoche
Assistant Examiner—Robert J. Pascal
Attorney, Agent, or Firm—Edward J. Radlo; Keith L. Zerschling

[57] ABSTRACT

A circuit for extending the frequency range of a digitally generated FM signal (f). A digital frequency generator (1) generates a precise FM waveform at a frequency up to about 50 MHz. Coupled to the FM signal (f) is a phase lock loop (53, 55, 57) comprising a voltage controlled oscillator (VCO) (57) whose output frequency can be much higher than the frequency of the FM signal (f). In a first embodiment, a crystal oscillator (61), mixer (59), and low pass filter (63) are used to bring the output (f') of the VCO (57) down into the range of the digital frequency generator (1). In a second embodiment, an analog frequency divider (73) is used to bring the output (f') of the VCO (57) into the range of the digital frequency generator (1). In a third embodiment, the single sideband (SSB) generator (37) from the digital frequency generator (1) and a counter (66) are used in a partly analog, partly digital, negative feedback loop.

7 Claims, 4 Drawing Figures

FREQUENCY EXTENDED DIGITALLY GENERATED FM

TECHNICAL FIELD

This invention pertains to the field of extending the frequency range of a frequency modulated (FM) signal that has been generated by digital means.

BACKGROUND ART

U.S. Pat. No. 4,286,237 illustrates a device using a voltage controlled oscillator (VCO) and a phase lock loop (PLL) in a frequency modulated (FM) system. The reference device differs from the present invention in that: (1) there is no disclosure of the FM being generated by digital means; (2) the PLL is operable only when the modulation is zero, whereas the PLL in the preesnt invention operates continuously; and (3) the device does not use the PLL to place the signal within a higher frequency range.

The device illustrated in U.S. Pat. No. 4,387,351 uses a VCO and an automatic frequency control (AFC) loop in an FM system. The reference device differs from the present invention in that: (1) there is no disclosure of the FM being generated by digital means; and (2) the PLL is not used to place the signal at a higher frequency range.

Other references are U.S. Pat. Nos. 3,622,913 and 4,074,209.

DISCLOSURE OF INVENTION

The present invention is a circuit for increasing the frequency of a digitally generated frequency modulated signal (f), comprising digital means (1) for generating the FM signal (f) and, coupled to the digitally generated FM signal (f), a phase lock loop (53, 55, 57) having a voltage controlled oscillator (57) whose output center frequency ($Nf'(c)$) is higher than the carrier frequency ($f(c)$) of the FM signal (f).

By use of this invention, highly reproducible FM waveforms can be achieved even at very high frequencies, high modulation rates, and large frequency deviations. Said FM waveforms have lower spurious signals than those generated by a digital frequency generator directly.

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Figure 1:
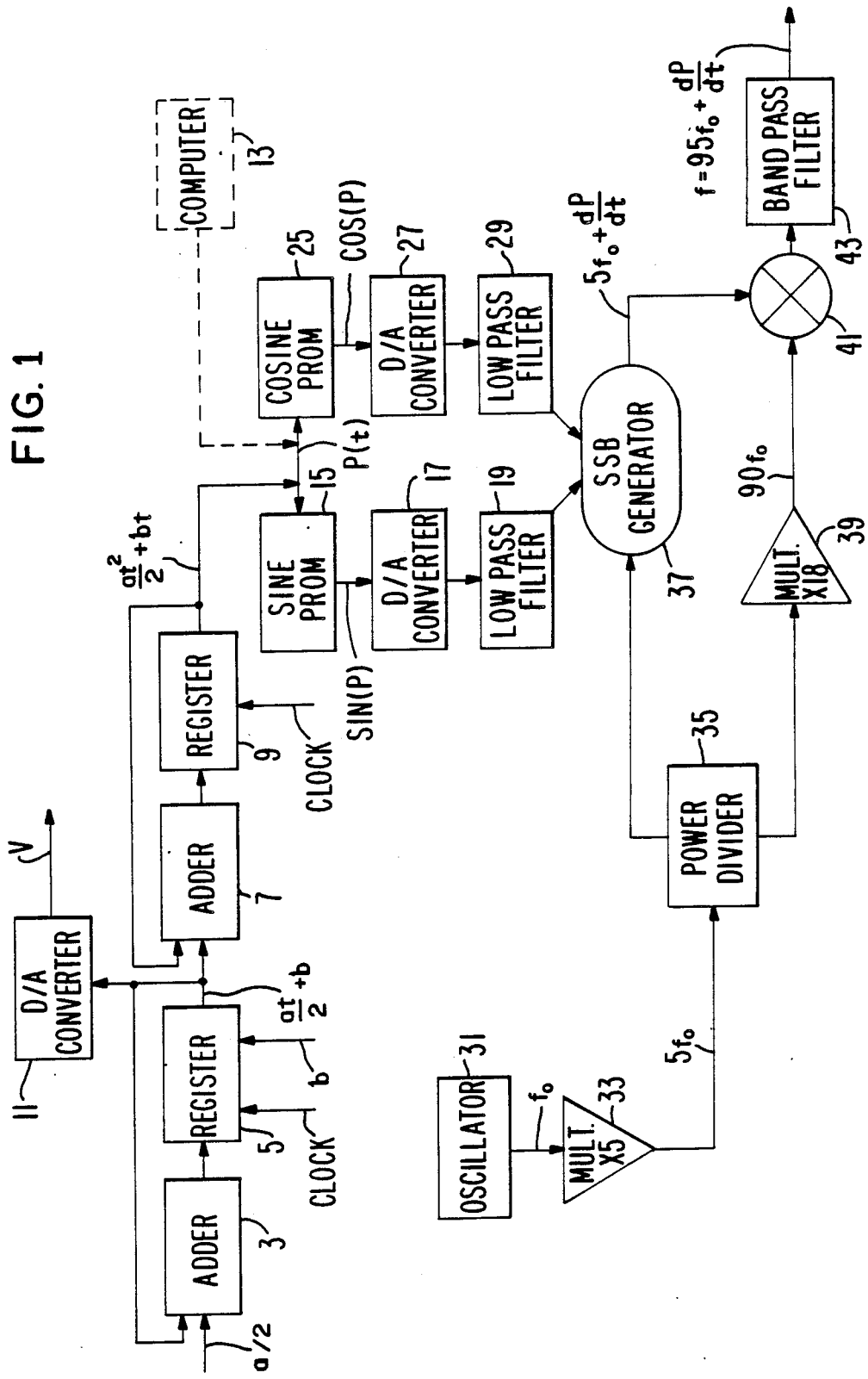
FIG. 1 is a block diagram of one means for digitally generating FM that is usable in conjunction with the present invention.

The circuit illustrated in FIG. 1 is one suitable means (1) for digitally generating FM for use in conjunction with the present invention. The circuit elements illustrated in solid lines were assembled successfully for a radar application requiring linear FM (chirp) signals having a deviation of ±350 KHz to a deviation of ±5 MHz on a 16.66 microsecond pulsewidth, and ±5 MHz deviation on a pulsewidth ranging from 16.66 microseconds down to 2.0 microseconds. The FIG. 1 embodiment is a highly versatile digital modulation scheme which overcomes problems inherent in prior art devices (deviable oscillators and SAW devices) by using simple techniques.

In the working embodiment, the phase P(t) of the desired FM signal is of the form $at^2/2+bt$, where a and b are independent constants. a is the slope of the desired linear FM signal f and b is the starting frequency of the FM signal f.

In the operational embodiment, a/2 and b are each 8 bit words fed as inputs to a first accumulator comprising adder 3 and register 5 connected in series. a/2 is fed to adder 3, and b, along with a synchronous clock input, is fed to register 5. The output from register 5 is fed back as a second input to adder 3. The output of the first accumulator is $at/2+b$, which is fed to digital-to-analog converter 11 and as a first input to a second accumulator comprising adder 7 and register 9 connected in series. The analog output of D/A converter 11 is control voltage V. The same clock as for register 5 clocks register 9, which has an output containing the phase $P(t)=at^2/2+bt$. This output is fed as an input to each of sine PROM 15 and cosine PROM 25, and as a feedback input to adder 7.

Each of adders 3, 7 and registers 5, 9 is a 16 bit device for which only the first eight significant bits are used for the output. Use of 8 bits gives a phase quantization (accuracy) of 1.41° (out of 360°). Registers 5, 9 are driven at a clock frequency of 10 MHz (corresponding to a sampling time of 0.1 microseconds) to establish the t (time) factor in the P(t).

If it is desired that the phase P(t) be a more complex modulation pattern, such as a pattern representing voice or video data, the phase can be generated by an optional digital computer 13. In any event, the phase P(t) is fed to two programmable read only memories (PROMs), sine PROM 15 and cosine PROM 26, which contain lookup tables to convert P to the sine and cosine of P, respectively. PROMs 15 and 25 are clocked by the same synchronous clock that clocks registers 5 and 9.

PROMs 15, 25 are quantized indentically in P to 1.41° accuracy; hence, for a given value of P, the outputs of the PROMs 15, 25 remain orthogonal as desired. The PROM 15, 25 outputs are fed to digital-to-analog converters 17, 27, respectively, and then to low pass filters 19, 29, respectively, to produce analog signals which drive a single sideband (SSB) generator 37. SSB generator 37 places the modulation frequency $f(m)=dp/dt$ on an intermediate frequency (IF) carrier $f(c)=5f_o$. Whether an upper or lower sideband is generated depends upon systems requirements.

The $5f_0$ IF is generated from a reference oscillator 31 having an outut frequency of $f_0$ which passes through multiplier 33, multiplying the frequency by a factor of 5 to produce the $5f_0$ IF. This IF is then split equally by power divider 35, a first output of which becomes an input to SSB generator 37 and a second output of which is multiplied by multiplier 39 by a factor of 18 to create an HF (high frequency) of $90f_0$. The modulated IF outputted by SSB generator 37 and the $90f_0$ HF are mixed by mixer 41, producing sum and difference frequencies $95f_0+dP/dt$ and $85f_0-dP/dt$. $dP/dt=at+b=f(m)$, the modulating signal. (In the notation used in this specification, a signal is often referred to by its frequency.) The output of mixer 41 passes through bandpass filter 43, which rejects the difference frequency and outputs the digitally generated FM signal $f = f(c) + f(m)$, where f(c) is the carrier frequency 95$f_o$ and f(m) is the modulating frequency dP/dt. The particular frequency relationships shown are for an X-band system and were selected to simplify filtering.

The circuit described in FIG. 1 desirably generates very precise linear, repeatable waveforms. However, digital hardware items such as adders 3, 7 and multipliers 33, 39 are currently limited to operation at clock frequencies below 50 MHz. To achieve the linearity and precision advantages of the digitally generated FM at high frequencies, one needs a circuit to extend the frequency range of the digitally generated FM, such as one of the circuits described in FIGS. 2-4.

Figure 2:
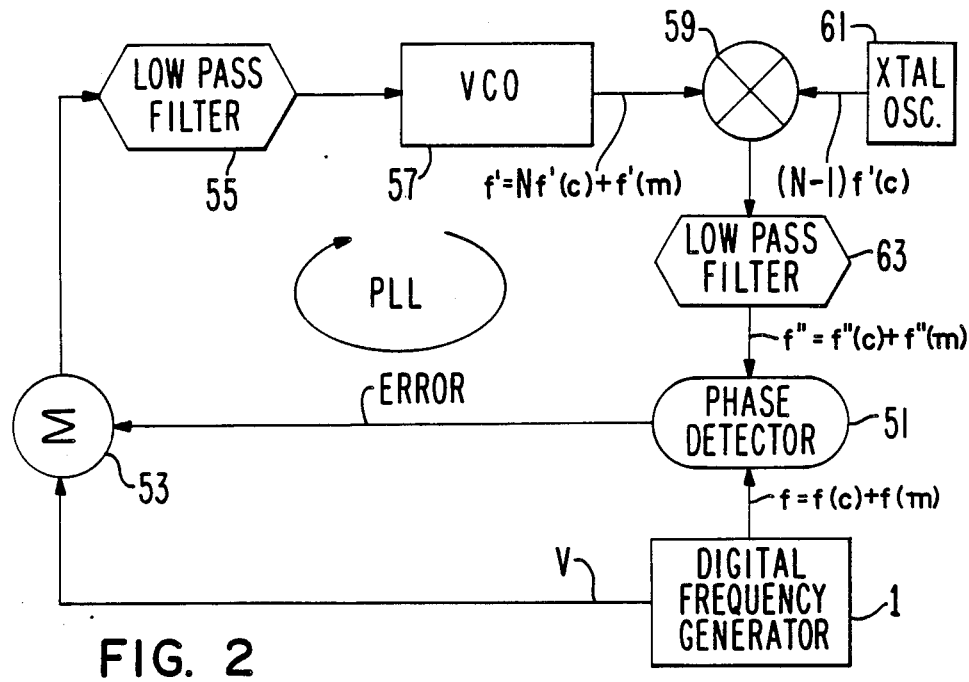
FIG. 2 is a block diagram of a first embodiment of the present invention.
Figure 3:
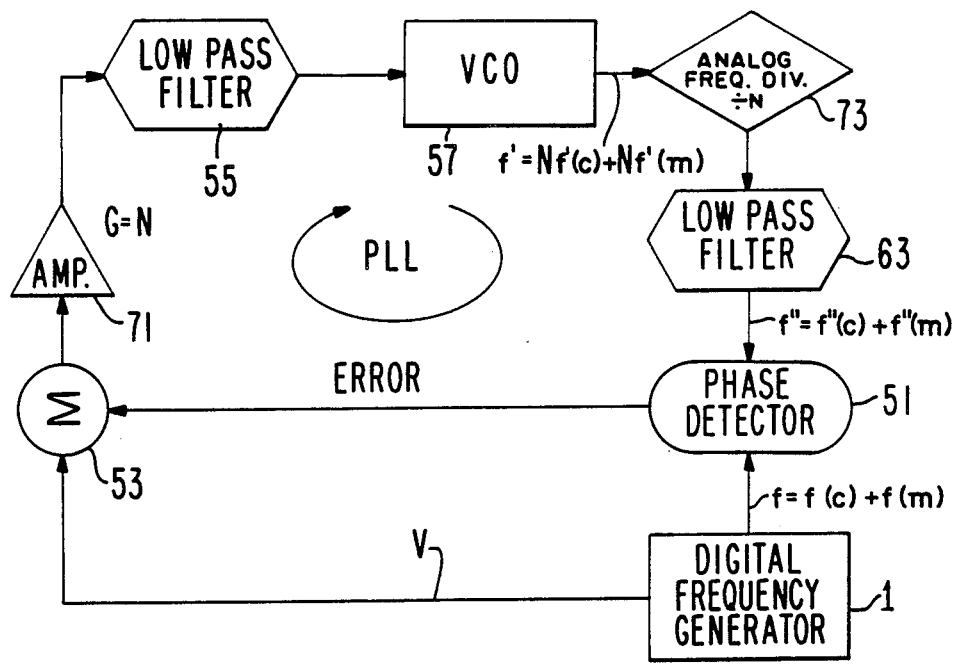
FIG. 3 is a block diagram of a second embodiment of the present invention.
Figure 4:
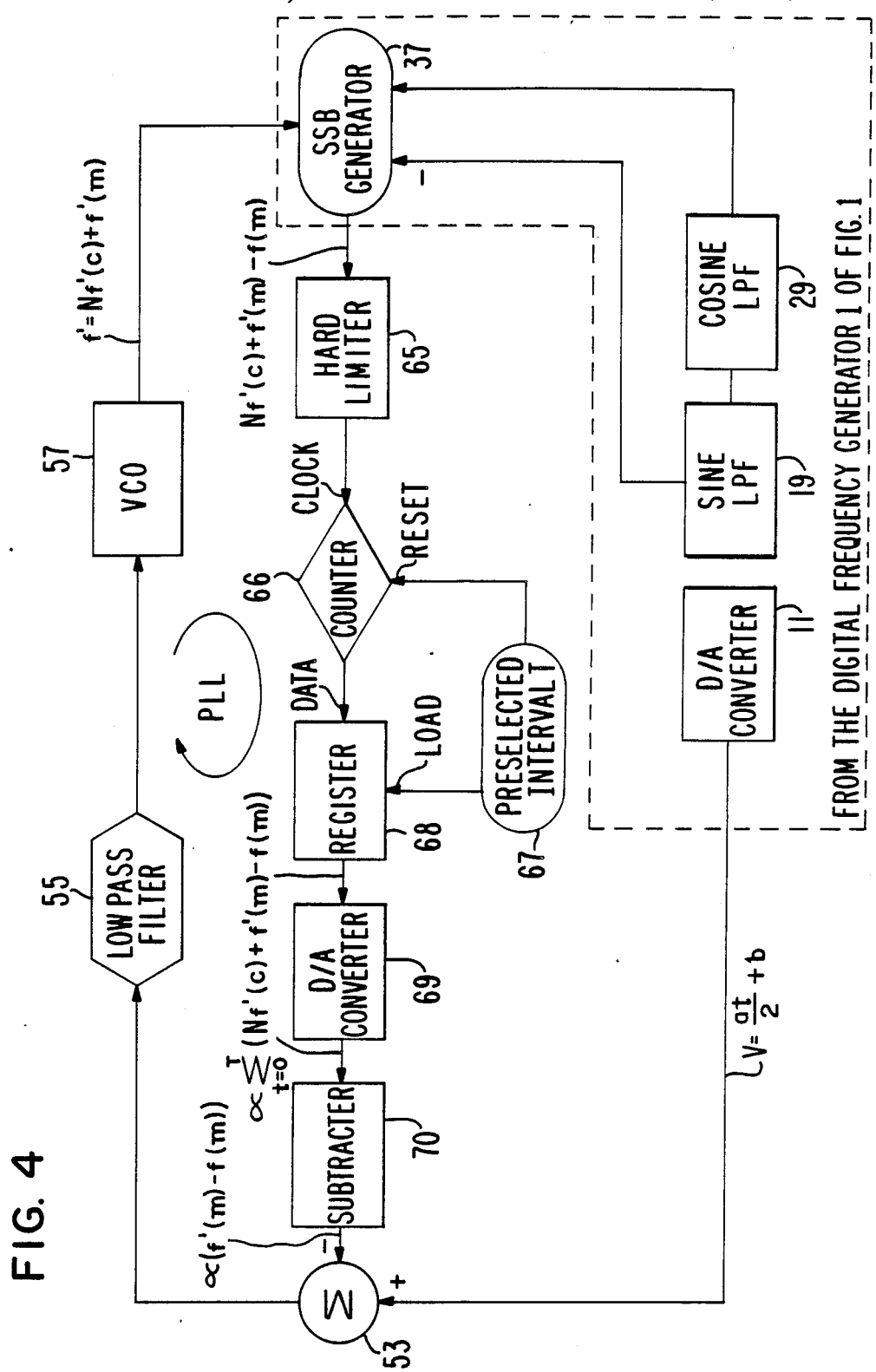
FIG. 4 is a block diagram of a third embodiment of the present invention.

In FIGS. 2-4, a voltage controlled oscillator (VCO) 57 is locked to the digitally generated FM signal F by using a phase lock loop (PLL) comprising elements 53, 55, 57, and additional elements. This permits the VCO 57 output signal to have a center frequency Nf(c) and/or modulation that is beyond the capabilities of the digital frequency generator 1, while permitting use of the digitally generated signal f as the reference signal in the PLL 53, 55, 57. The circuits of FIGS. 2 and 3 permit rapid response control loops. The circuit shown in FIG. 4 simplifies the analog hardware while exhibiting a slower response time.

FIG. 2 shows a configuration usable when the required output frequency f' is greater than the frequency capabilities of the digital circuitry, but the required modulation f'(m) is within the capabilities of the digital hardware. In the notation used here, primes are placed after the frequencies emanating from VCO 57, to indicate that this scaling is not exact due to nonlinearities in the circuit components. For this same reason, double primes are placed after the frequencies emanating from low pass filter 63.

The output f of digital frequency generator 1 typically ranges up to 50 MHz. In FIG. 2, the carrier frequency f(c) is scaled by a factor of N but the modulating frequency f(m) is not increased. The scaling factor N does not have to be an integer in the FIG. 2 and 4 embodiments. However, in FIG. 3, N must be an integer due to the presence of frequency divider 73.

In FIG. 2, we see that the digitally generated FM signal f emanates from a digital frequency generator 1 such as that illustrated in FIG. 1. A control voltage V is also generated by generator 1. In this case, the output of D/A converter 11 is such a usable voltage V. $V = at/2 + b$ and becomes one of the inputs to summation circuit 53. The purpose of control voltage V is to "prime the pump" of VCO 57, i.e., force VCO 57 to start oscillating. A second input to summation circuit 53 is an error signal equaling the phase of signal f'' minus the phase of signal f as measured by phase detector 51. f'' is the frequency of the loop signal as it exists low pass filter 63. $f'' = f''(c) + i\ f''(m)$, where f''(c) is the carrier frequency and f''(m) is the modulating frequency.

The output of summation circuit 53 is low pass filtered by filter 55 to suppress noise such as the digitally generated noise from generator 1. The output of filter 55 is passed to VCO 57, e.g., a GUNN oscillator, which advantageously can have a very high output frequency. VCO 57 is an oscillator whose output frequency is ideally linearly related to the instantaneous voltage at its input. In this embodiment, the output from VCO 57 has a frequency of $f' = Nf(c) + f(m)$; where N is an arbitrary scaling factor depending upon systems considerations. f' is the desired output signal, and would precisely equal $Nf(c) + f(m)$ except for unavoidable component nonlinearities. f' is also fed as a first input to mixer 59. A second input to mixer 59 comes from reference crystal oscillator 61, which is made to oscillate at a frequency of $(N-1)f'(c)$.

The output of mixer 59 is the sum frequency $(2N-1)f'(c) + f'(m)$ and the difference frequency $f'(c) + f'(m)$. This result is fed as the input to low pass filter 63, which outputs the loop frequency f'', the difference frequency. f'' is not exactly equal to $f'(c) + f'(m)$ because of unavoidable component nonlinearities.

The circuit shown in FIG. 3 also provides a fast response time and permits generation of an accurate and stable output signal f'. In this embodiment, the output center frequency Nf'(c) and modulation frequency Nf'(m) are both beyond the capabilities of current digital hardware.

The FIG. 3 circuit is identical to the FIG. 2 circuit except for the following differences. An analog divide-by-N frequency divider 73 is inserted between the output of VCO 57 and the input of low pass filter 63, in lieu of mixer 59 and oscillator 51. Frequency divider 73 is commercially available up to frequencies in the 2 GHz range. By this means, the center frequency Nf'(c) and modulation frequency Nf'(m) are placed within the range of the digital frequency generator 1. After phase detection of the difference error signal by detector 51, and addition of the error signal and control voltage V at summation cicuit 53, the signal is amplified by a factor N by amplifier 71 having a voltage gain G=N. This steps up the voltage by a factor of N to compensate for the factor of N that was lost in frequency divider 73. In this embodiment, low pass filters 55 and 63 each serve to suppress digitally generated noise.

The embodiment illustrated in FIG. 4 has the same output $f' = Nf'(c) + f'(m)$ as the FIG. 2 embodiment. The FIG. 4 embodiment offers the advantage that the cost of the following is saved: crystal oscillator 31 and accompanying items from the digital frequency generator 1 illustrated in FIG. 1; and phase detector 51 from the FIG. 2 embodiment.

In this embodiment, the output signal $f' = Nf'(c) + f'(m)$ from VCO 57 replaces the signal from oscillator 31 in the digital frequency generator 1 of FIG. 1. SSB generator 37 is used to remove the modulation from said VCO 57 output signal. The inputs to SSB generator 37 are the output from VCO 57, and the outputs from low pass filters 19 and 29 as before. The output from filter 19, corresponding to the sine of the phase P, is inverted prior to being applied to generator 37.

The output of SSB generator 37 is a signal having a frequency $Nf'(c) + f'(m) - f(m)$. This signal is amplified and clipped by hard limiter 65, which outputs a +1 or −1 at a rate equal to Nf'(c). The output of hard limiter 65 is then converted to a phase signal by counter 66 and register 68. The output of limiter 65 is fed to the clock input of counter 66. A preselected counting interval T, which is stored by register 67 and is an integral number of cycles of Nf'(c), is fed to the reset input of counter 66 and to the load input of register 68. Counter 66, which acts like a digital low pass filter (integrator), counts the transitions in its input signal over the preselected interval T. This information is fed to register 68, which acts as a latch, and is outputted to digital-to-analog converter 69 at the conclusion of interval T. The output of register 68 is a digital word proportional to the frequency output of SSB generator 37. This digital word is converted to analog form by D/A converter 69.

Subtractor 70 subtracts out the term proportional to Nf(c), leaving the error team proportional to f'(m)−f(m). This is inverted (to create a negative feedback loop) and fed as a first input to summation circuit 53. The second input to summation circuit 53 is a control voltage such as $V=at/2+b$ as before, which can be supplied by D/A converter 11 from the FIG. 1 digital frequency generator. The output of summation circuit 53 is fed, as in the FIG. 2 embodiment, through low pass filter 55 to the input of VCO 57.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A circuit for increasing the frequency of a digitally generated FM signal, comprising:
   digital means for generating a frequency modulated (FM) signal; and
   coupled to the FM signal, a phase lock loop having a voltage controlled oscillator (VCO) whose output center frequency is higher than the carrier frequency of the FM signal, wherein the phase lock loop comprises:
   summation means;
   a first low pass filter having an input coupled to an output of the summation means;
   a voltage controlled oscillator having an input coupled to an output of the first low pass filter;
   a second low pass filter having an input coupled to an output of the voltage controlled oscillator; and
   a phase detector having a first input coupled to an output of the second low pass filter, a second input coupled to the digitally generated FM signal, and an output coupled to an input of the summation means;
   wherein the digitally generated FM signal comprises a carrier frequency and a modulating frequency;
   the phase lock loop boosts the carrier frequency, but not the modulating frequency;
   a mixer is coupled between the VCO and the second low pass filter, said mixer having a first input coupled to the output of the VCO, and an output coupled to the input of the second low pass filter; and
   a reference oscillator is coupled to a second input of the mixer.

2. A circuit for increasing the frequency of a digitally generated FM signal, comprising:
   digital means for generating a frequency modulated (FM) signal; and
   coupled to the FM signal, a phase lock loop having a voltage controlled oscillator (VCO) whose output center frequency is higher than the carrier frequency of the FM signal, wherein the phase lock loop comprises:
   summation means;
   a first low pass filter having an input coupled to an output of the summation means;
   a voltage controlled oscillator having an input coupled to an output of the first low pass filter;
   a second low pass filter having an input coupled to an output of the voltage controlled oscillator; and
   a phase detector having a first input coupled to an output of the second low pass filter, a second input coupled to the digitally generated FM signal, and an output coupled to an input of the summation means;
   wherein the digitally generated FM signal comprises a carrier frequency and a modulating frequency;
   the phase lock loop multiplies the carrier frequency and the modulating frequency by the same integer;
   an amplifier is coupled between the summation means and the first low pass filter, said amplifier having an input coupled to the output of the summation means and an output coupled to the input of the first low pass filter; and
   a frequency divider is coupled between the VCO and the second low pass filter, said frequency divider having a frequency division ratio equal to the gain of the amplifier, an input coupled to the output of the VCO, and an output coupled to the input of the second low pass filter.

3. A circuit for increasing the frequency of a digitally generated FM signal, comprising:
   digital means for generating a frequency modulated (FM) signal; and
   coupled to the FM signal, a phase lock loop having a voltage controlled oscillator (VCO) whose output center frequency is higher than the carrier frequency of the FM signal, wherein the phase lock loop comprises:
   summation means;
   a low pass filter having an input coupled to an output of the summation means;
   a voltage controlled oscillator (VCO) having an input coupled to an output of the low pass filler;
   a single sideband (SSB) generator having an input coupled to an output of the VCO; and
   a counter having an input indirectly coupled to an output of the SSB generator and an output indirectly coupled to an input of the summation means.

4. A circuit for increasing the frequency of a digitally generated FM signal, comprising:
   digital means for generating a frequency modulated (FM) signal; and
   coupled to the FM signal, a phase lock loop having a voltage controlled oscillator (VCO) whose output center frequency is higher than the carrier frequency of the FM signal;
   wherein the digital generating means comprises:
   means for producing the desired phase of the FM signal;
   coupled to the producing means, means for generating the sine of the desired phase;
   coupled to the producing means, means for generating the cosine of the desired phase;
   a reference oscillator; and
   a single sideband generator having a first input coupled to the reference oscillator, a second input coupled to the sine generating means, a third input coupled to the cosine generating means, and an output conveying the digitally generated FM signal.

5. The circuit of claim 4 wherein the reference oscillator generates an intermediate frequency fed to the first input of the SSB generator;
   the intermediate frequency is converted to an HF carrier frequency and fed to a first input of a mixer;
   the output of the SSB generator is fed to a second input of the mixer; and the mixer has an output that passes through a bandpass filter to become the digitally generated FM signal.

6. The circuit of claim 4 wherein the phase producing means comprises a digital computer.

7. The circuit of claim 4 wherein the phase producing means comprises first and second series-connected accumulators;

the phase is of the form $(at^2/2)+bt$, where a is a constant representing the linear slope of the desired FM signal and b is a constant representing the starting frequency of the desired FM signal; and a/2 and b are fed as inputs to the first accumulator.

* * * * *

UNITED STATES PATENT AND TRADEMARK OFFICE
CERTIFICATE OF CORRECTION

PATENT NO. : 4,706,047
DATED : November 10, 1987
INVENTOR(S) : Louis J. Avila, John E. Merritt, Norman G. Hempling It is certified that error appears in the above-identified patent and that said Letters Patent are hereby corrected as shown below:

In Column 6, line 34, delete "filler" and insert in place thereof --filter--.

Signed and Sealed this

Nineteenth Day of April, 1988

Attest:

DONALD J. QUIGG

Attesting Officer

Commissioner of Patents and Trademarks